US012348066B2

(12) United States Patent
Polat et al.

(10) Patent No.: US 12,348,066 B2
(45) Date of Patent: Jul. 1, 2025

(54) CHARGER WITH BATTERY PACK COOLING FAN

(71) Applicant: TECHTRONIC CORDLESS GP, Anderson, SC (US)

(72) Inventors: Ece Polat, Greenville, SC (US); Adam Zwilling, Pendleton, SC (US); Nicolas James Hanks, Anderson, SC (US); Shiyi Zhang, Anderson, SC (US); Krishna Sai Teja Kalavala, Greenville, SC (US); John Robert Lyons, Piedmont, SC (US)

(73) Assignee: Techtronic Cordless GP, Anderson, SC (US)

( * ) Notice: Subject to any disclaimer, the term of this patent is extended or adjusted under 35 U.S.C. 154(b) by 179 days.

(21) Appl. No.: 18/048,798

(22) Filed: Oct. 21, 2022

(65) Prior Publication Data
US 2024/0136836 A1 Apr. 25, 2024
US 2024/0235226 A9 Jul. 11, 2024

(51) Int. Cl.
*H05K 7/20* (2006.01)
*H02J 7/00* (2006.01)

(52) U.S. Cl.
CPC ........ *H02J 7/0045* (2013.01); *H05K 7/20145* (2013.01); *H05K 7/20172* (2013.01)

(58) Field of Classification Search
CPC .............. H02J 7/0045; H05K 7/20145; H05K 7/20172
See application file for complete search history.

(56) References Cited

U.S. PATENT DOCUMENTS

| | | |
|---|---|---|
| 6,373,228 B1 | 4/2002 | Sakakibara |
| 6,833,685 B2 | 12/2004 | Howard et al. |
| 6,878,481 B2 | 4/2005 | Bushong et al. |
| 6,949,914 B2 | 9/2005 | Aradachi et al. |
| 6,967,464 B2 | 11/2005 | Heigl et al. |
| 7,288,920 B2 | 10/2007 | Bushong et al. |
| 7,372,237 B2 | 5/2008 | Bushong et al. |
| 7,446,508 B2 | 11/2008 | Aradachi et al. |
| 7,456,605 B2 | 11/2008 | Nakasho et al. |
| 7,557,542 B2 | 7/2009 | Bushong et al. |

(Continued)

FOREIGN PATENT DOCUMENTS

| | | |
|---|---|---|
| AU | 2017265171 B2 | 5/2019 |
| CN | 211127200 U | 7/2020 |

(Continued)

OTHER PUBLICATIONS

Extended European Search Report for Application No. 23202251.7 dated Mar. 21, 2024 (7 pages).

*Primary Examiner* — Michael A Matey
(74) *Attorney, Agent, or Firm* — Michael Best & Friedrich LLP

(57) ABSTRACT

A charger including a vertical section including a first surface, the first surface facing a front direction and including an attachment portion configured to a receive a battery pack, and a horizontal section configured to protrude, in the front direction, from a bottom portion of the vertical section. The charger further including a second surface disposed on the horizontal section, the second surface facing an upward direction, and a fan disposed proximate the horizontal surface, the fan configured to cool the battery pack.

19 Claims, 6 Drawing Sheets

(56) References Cited

U.S. PATENT DOCUMENTS

| | | |
|---|---|---|
| 7,589,493 B2 | 9/2009 | Satsuma |
| 7,692,408 B2 | 4/2010 | Miyazaki et al. |
| 7,859,220 B2 | 12/2010 | Bushong et al. |
| 7,868,588 B2 | 1/2011 | Altekruse et al. |
| RE42,468 E | 6/2011 | Heigl et al. |
| 7,956,575 B2 | 6/2011 | Kawano et al. |
| 9,225,184 B2 | 12/2015 | Rief |
| 9,608,461 B2 | 3/2017 | Chen et al. |
| 9,728,822 B2 | 8/2017 | Taga |
| 9,837,839 B2 | 12/2017 | Orr et al. |
| 10,103,365 B2 | 10/2018 | Zhang et al. |
| 10,630,088 B2 * | 4/2020 | Seidel ............... H02J 7/0042 |
| 10,700,538 B2 | 6/2020 | Reed |
| 10,827,655 B2 | 11/2020 | Truettner et al. |
| 10,840,567 B2 | 11/2020 | Ida et al. |
| 11,183,855 B2 | 11/2021 | Reed |
| 2002/0034682 A1 * | 3/2002 | Moores, Jr. ........ H02J 7/0044 |
| | | 429/71 |
| 2004/0145344 A1 | 7/2004 | Bushong et al. |
| 2008/0290836 A1 * | 11/2008 | Tsai .................. H05K 7/20136 |
| | | 361/695 |
| 2014/0197803 A1 | 7/2014 | Ishikawa |
| 2015/0188333 A1 | 7/2015 | Zhang et al. |
| 2015/0303531 A1 | 10/2015 | Willgert et al. |
| 2016/0240901 A1 * | 8/2016 | Kondo ............. H01M 10/6235 |
| 2016/0294203 A1 * | 10/2016 | Teng ................. H02J 7/0013 |
| 2018/0198292 A1 | 7/2018 | Lee et al. |
| 2019/0348724 A1 | 11/2019 | Satoh |
| 2020/0411923 A1 * | 12/2020 | Sedlmayr .......... H01M 10/6561 |
| 2021/0022272 A1 | 1/2021 | Truettner et al. |
| 2021/0167430 A1 * | 6/2021 | Silha ................. H02J 7/0045 |
| 2022/0079702 A1 | 3/2022 | Reed |
| 2022/0123569 A1 | 4/2022 | Kataoka et al. |
| 2023/0238814 A1 * | 7/2023 | Lu ..................... H01M 10/6551 |
| | | 320/107 |

FOREIGN PATENT DOCUMENTS

| | | |
|---|---|---|
| CN | 211456714 U | 9/2020 |
| CN | 112636432 A | 4/2021 |
| CN | 112993460 A | 6/2021 |
| CN | 215911524 U | 2/2022 |
| DE | 102010039363 A1 | 2/2012 |
| DE | 102017211205 A1 | 1/2019 |
| DE | 102019209325 A1 | 12/2020 |
| GB | 2449444 A1 | 11/2008 |
| GB | 2452604 B | 10/2009 |
| WO | 2017002520 A1 | 1/2017 |
| WO | 2018117553 A1 | 6/2018 |
| WO | 2021113426 A1 | 6/2021 |
| WO | 2021150156 A1 | 7/2021 |

* cited by examiner

CHARGER WITH BATTERY PACK COOLING FAN

FIELD OF THE DISCLOSURE

The present disclosure relates to battery chargers.

SUMMARY OF THE DISCLOSURE

Battery chargers may receive a battery pack and charge the battery pack by providing a charging current to the battery pack. Battery chargers may also include a cooling fan to provide cooling air to the battery pack and/or internal components of the battery charger. Battery chargers may further include multiple air inlets to provide cooling air to internal components of the battery charger, however known designs may be met with air intake control, air exhaust control, and size constraints.

The disclosure provides, in one aspect, a charger including a vertical section, a horizontal section, a first surface, a second surface, and a fan. The vertical section includes the first surface and the first surface faces a front direction. The first surface includes an attachment portion that receives a battery pack. The horizontal section protrudes, in the front direction, from a bottom portion of the vertical section. The second surface is disposed on the horizontal section. The second surface faces an upward direction. The fan is disposed on the horizontal surface and cools the battery pack.

In some aspects, an entirety of the fan overlaps the battery pack in the upward direction.

In some aspects, the fan includes an outlet, the outlet disposed directly below the battery pack.

In some aspects, the charger further includes a first air inlet, a second air inlet, and a third air inlet. The first air inlet disposed on the first surface, the first air inlet positioned above the attachment portion. The second air inlet disposed on a first side of the vertical section, the second air inlet including a patterned surface. The third air inlet disposed on a first intermediate side of the horizontal section, the intermediate side located between the first side of the vertical section and a front side of the horizontal section.

In some aspects, the charger further includes a fourth air inlet and a fifth air inlet. The fourth air inlet disposed on a second side of the vertical section, the fourth air inlet positioned to correspond to the second air inlet across a median plane of the charger. The fifth air inlet disposed on a second intermediate side of the horizontal section, the fifth air inlet positioned to correspond to the third air inlet across the median plane of the charger.

In some aspects, the charger further includes a circuit board disposed in the vertical section, the circuit board positioned perpendicular to the front direction.

In some aspects, the circuit board controls an operation of the fan.

In some aspects, the fan pulls air through the vertical section. The fan also cools the circuit board using the air pulled from the vertical section. The fan also exhausts the air from the outlet.

In some aspects, the vertical section is oriented at a first angle between 75 degrees and 105 degrees relative to the horizontal section.

In some aspects, the horizontal section is oriented at a second angle between −15 degrees and 15 degrees relative to the vertical section.

The disclosure provides, in another aspect, a system including a battery pack and a charger. The charger includes an attachment portion that receives the battery pack. The charger also includes a vertical section that further includes a first surface, the first surface facing a front direction and including the attachment portion. The charger further includes a horizontal section that extends, in the front direction, from a bottom portion of the vertical section. The charger also includes second surface disposed on the horizontal section, the second surface facing an upward direction. The charger further includes a fan disposed on the second surface, the fan cools the battery pack.

Other aspects of the disclosure will become apparent by consideration of the detailed description and accompanying drawings.

Before any embodiments of the disclosure are explained in detail, it is to be understood that the present subject matter is not limited in its application to the details of construction and the arrangement of components set forth in the following description or illustrated in the following drawings. The present subject matter is capable of other embodiments and of being practiced or of being carried out in various ways.

DETAILED DESCRIPTION

Figure 1:
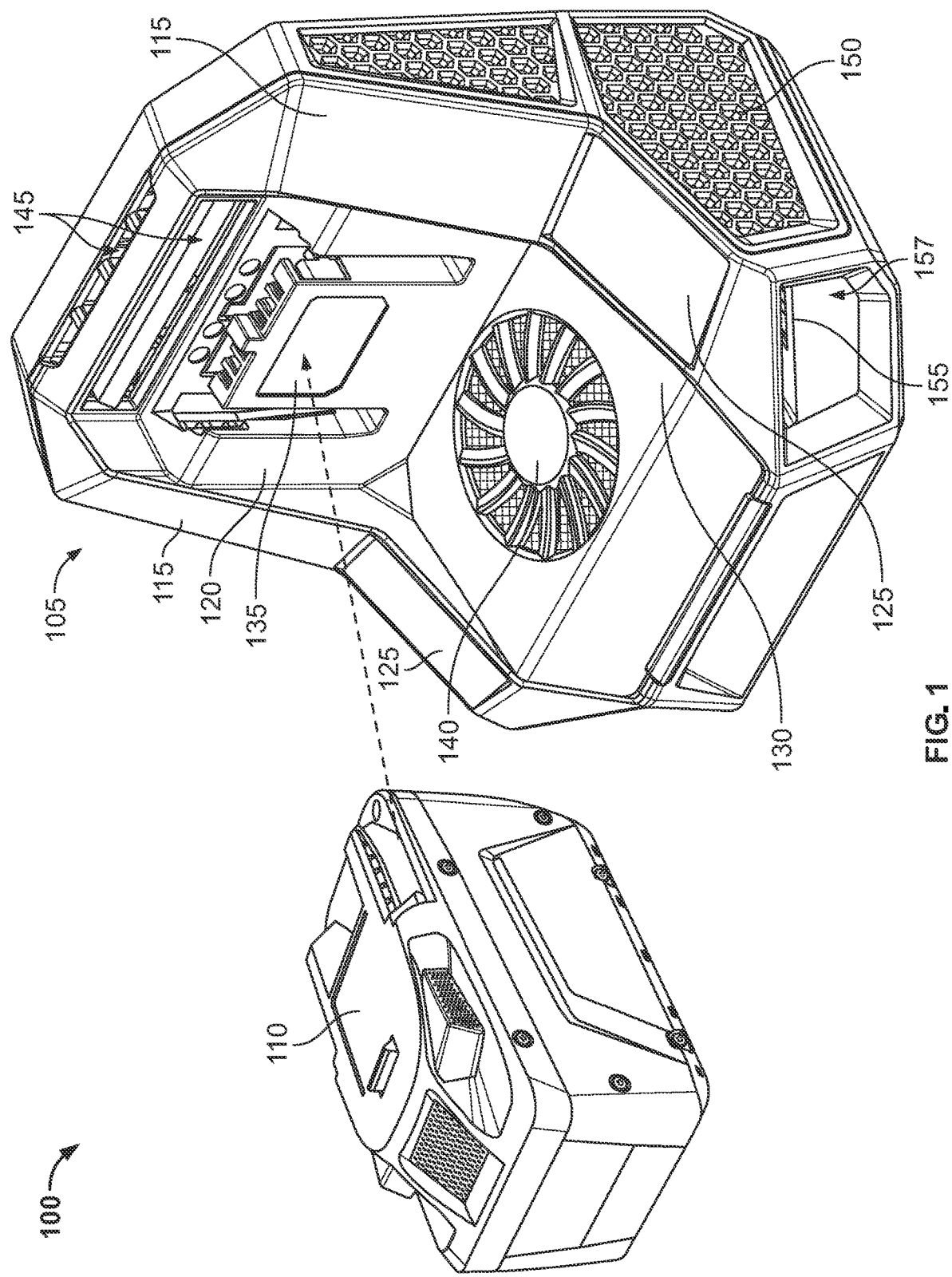
FIG. 1 illustrates a system including a battery charger and a battery pack in accordance with an embodiment of the disclosure.

FIG. 1 illustrates a system 100 including a battery charger 105 and a battery pack 110 according to some embodiments. The battery charger 105 may receive the battery pack 110 and charge the battery pack 110. In some examples, the battery charger 105 may receive more than one battery pack 110. The battery pack 110 may include one or more battery cells, for example, lithium-ion battery cells or any other suitable battery cells. In some examples, the battery pack 110 may be attachable to a power tool in order to supply operational power to the power tool when electrically and mechanically connected to the power tool.

The battery charger 105 may include one or more vertical sections 115. The vertical section 115 may further include a first surface 120. The battery charger 105 may further include one or more horizontal sections 125. The horizontal section 125 may further include a second surface 130. The first surface 120 may face a first direction (or a front direction) (D1 of FIG. 3) and further include an attachment portion 135. The attachment portion 135 may receive the battery pack 110. In some examples, the attachment portion 135 may further include a plurality of battery receiving terminals and one or more rails to electrically and mechanically connect the battery pack 110 to the attachment portion 135. In some examples, when the battery pack 110 connects to the attachment portion 135, the battery charger 105 supplies a charging current to charge the battery pack 110 according to a nominal charging capacity of the battery pack 110. The horizontal section 125 may protrude from a bottom portion of the vertical section 115 in the first direction D1.

The battery charger 105 may further include a fan 140 disposed beneath the second surface 130. The second surface 130 may face a second direction (or an upward direction) (D2 of FIG. 3), perpendicular to the first direction. The fan 140 may cool the battery pack 110 by providing cooling air in the second direction D2 toward the battery pack 110 when the battery pack 110 is received within the attachment portion 135. The battery charger 105 may further include a plurality of air inlets, for example, but not limited to, a first air inlet 145, a second air inlet 150, and a third air inlet 155. The first air inlet 145 may be disposed proximate the first surface 120 and may be positioned above the attachment portion 135. The first air inlet 145 may receive air from ambient surroundings of the battery charger 105. The second air inlet 150 may be disposed on first and second sides of the battery charger 105 and may further include a patterned surface. The second air inlet 150 may receive air from ambient surroundings of the battery charger 105. The third air inlet 155 may be disposed on a first intermediate portion side 157 below the horizontal section 125. The third air inlet 155 may receive air from ambient surroundings of the battery charger 105. In some examples, the vertical section 115 may be oriented at approximately a right angle relative to the horizontal section 125 as the horizontal section 125 protrudes from the vertical section 115 in the first direction D1. For example, if the first side of the battery charger 105 is oriented on a coordinate plane (e.g., a coordinate plane including x, y, and z-axes), the horizontal section 125 may be located at 0 degrees along the x-axis. The vertical section 115 may be located at approximately 90 degrees, relative to the horizontal section 125, along the y-axis. In some examples, the vertical section 115 may be oriented at a first angle within a range of approximately 75 degrees and approximately 105 degrees relative to the horizontal section 125. In some examples, the horizontal section 125 may be oriented at a second angle between approximately −15 degrees and approximately 15 degrees relative to the vertical section 115.

Figure 2:
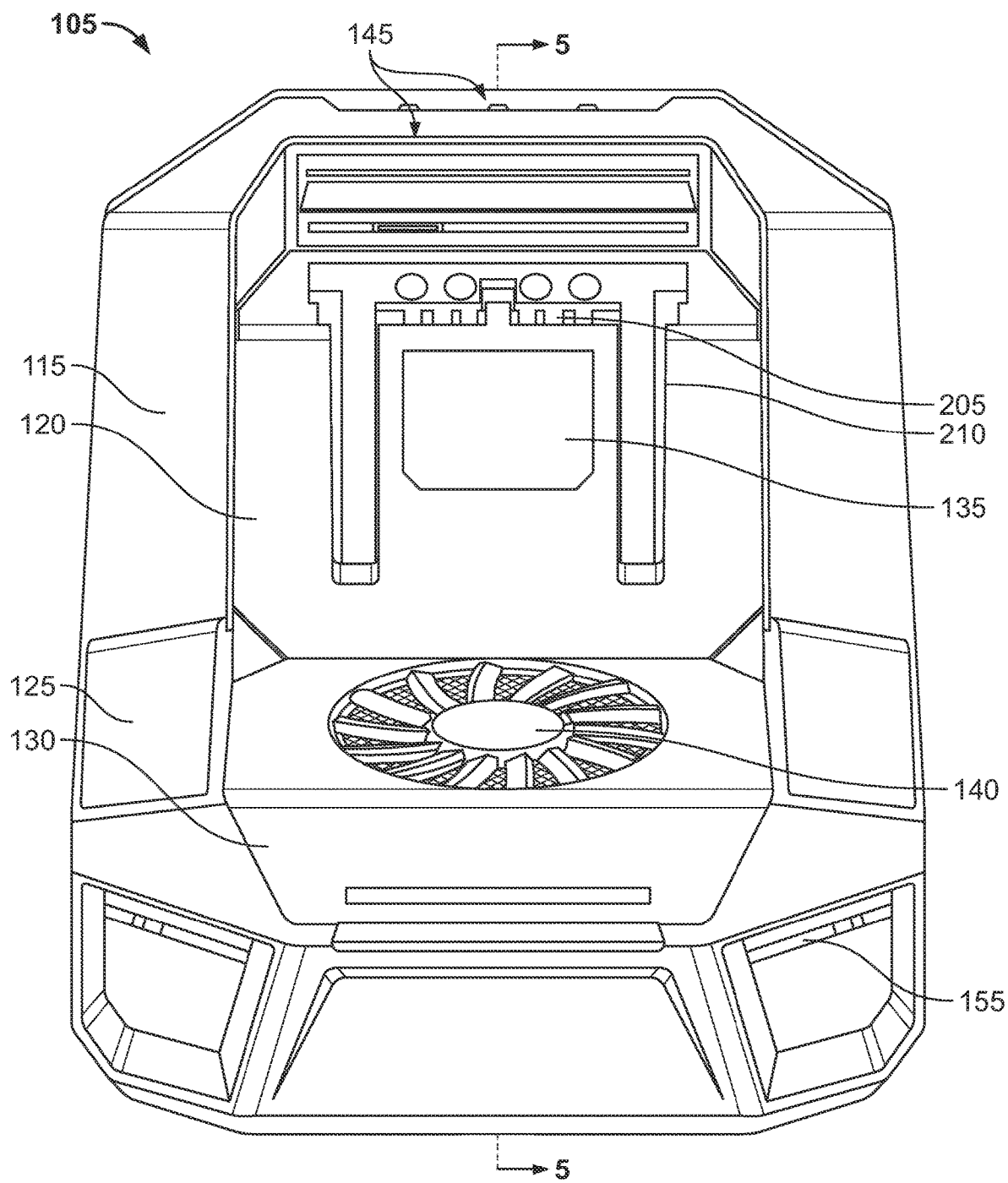
FIG. 2 illustrates a front view of the battery charger of the system of FIG. 1 in accordance with an embodiment of the disclosure.

In some examples, the second air inlet 150 and the third air inlet 155 may be disposed on a first one of the one or more vertical sections 115 and a first one of the one or more horizontal sections 125 (i.e., a first side of the battery charger 105 defined by line 5-5 of FIG. 2). In some examples, the battery charger 105 may further include a fourth air inlet and a fifth air inlet. The fourth air inlet may be disposed on a second one of the one or more vertical sections 115. The fourth air inlet may be positioned opposite to the second air inlet 150 across a median plane (e.g., line 5-5 of FIG. 2) of the battery charger 105 (e.g., the fourth air inlet may be located on the second one of the one or more vertical sections 115 and mirrors the second air inlet 150 across the middle of the battery charger 105). The fifth air inlet may be disposed on a second intermediate portion side 157 below a second one of the one or more horizontal sections 125. The fifth air inlet may be positioned opposite to the third air inlet 155 across the median plane of the battery charger 105 (e.g., the fifth air inlet may be located on the second intermediate portion side 157 and mirrors the third air inlet 155 across the middle of the battery charger 105).

FIG. 2 illustrates a front view of the battery charger 105 according to some embodiments. The one or more first air inlets 145 may be disposed on, or proximate, the first surface 120 and may be positioned above the attachment portion 135. As illustrated in FIG. 2, the attachment portion 135 may further include a plurality of battery receiving terminals 205 and one or more rails 210 to electrically and mechanically connect the battery pack 110 to the attachment portion 135. In some examples, when the battery pack 110 connects to the attachment portion 135, the battery charger 105 supplies a charging current to charge the battery pack 110 according to a nominal charging capacity of the battery pack 110. In some examples, the plurality of battery receiving terminals 205 provide an electrical connection between the battery charger 105 and the battery pack 110 when the battery pack 110 is attached to the battery charger 105. In some examples, the one or more rails 210 provide a mechanical connection between the battery charger 105 and the battery pack 110 when the battery pack 110 is attached to the battery charger 105.

Figure 3:
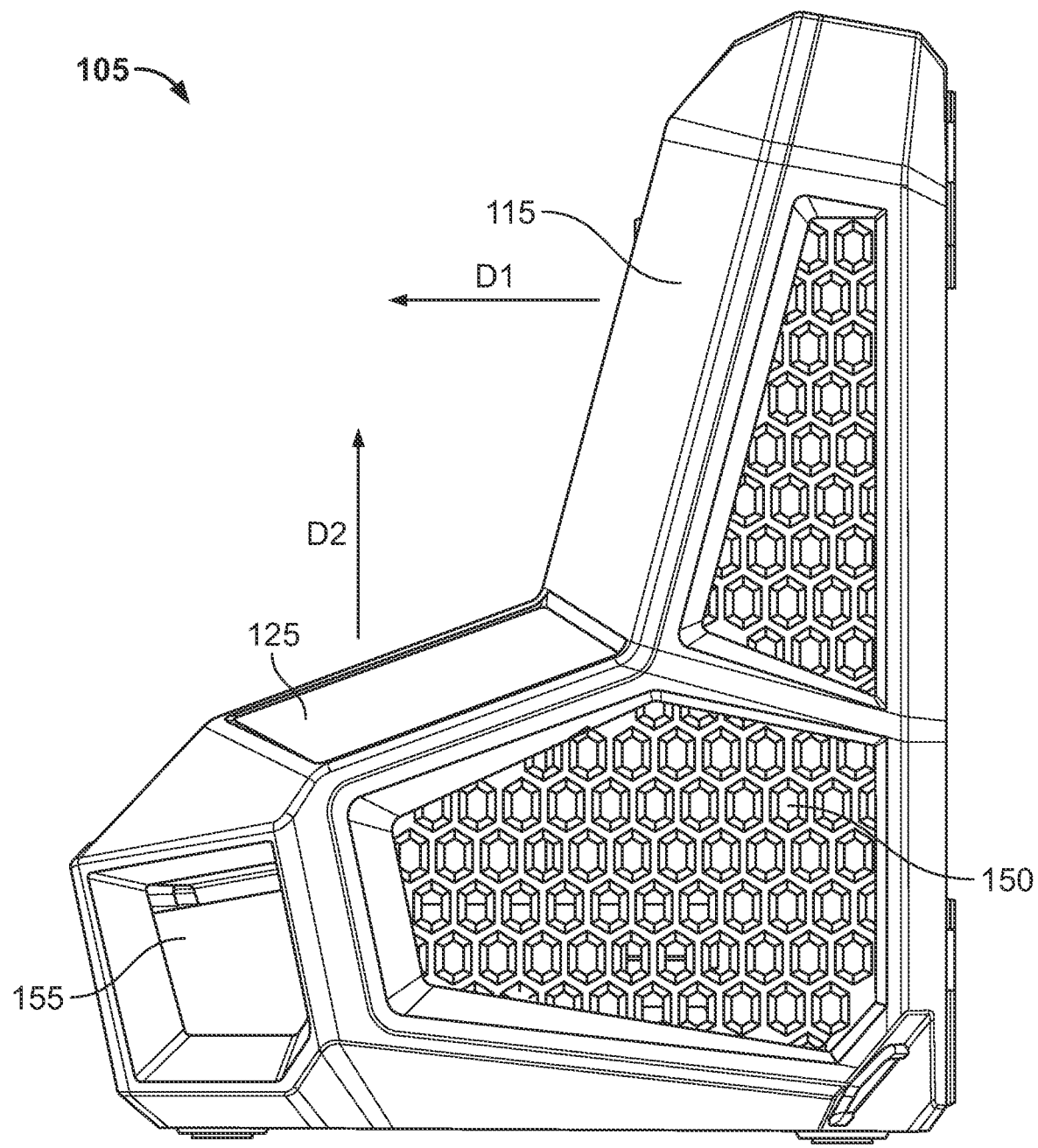
FIG. 3 illustrates a side view of the battery charger of the system of FIG. 1 in accordance with an embodiment of the disclosure.

FIG. 3 illustrates a side view of the battery charger 105 according to some embodiments. The battery charger 105 includes the vertical section 115, the horizontal section 125, the second air inlet 150, and the third air inlet 155. As illustrated, the first surface 120 may face the first direction D1. The first direction D1 may extend away from the first surface 120 in the direction that the horizontal section 125 protrudes from the vertical section 115. The attachment portion 135 may also face in the first direction D1. In some examples, the second surface 130 may face the second direction D2. The second direction D2 may extend away from the second surface 130 in the vertical direction of the vertical section 115 in comparison to the horizontal section 125. The fan 140 may also face in the second direction D2. When the battery pack 110 is connected to the battery charger 105 via the attachment portion 135, an entirety of the fan 140 may overlap the battery pack 110 and provide air flow in the second direction D2 to provide cooling air to the battery pack 110. In some examples, the fan 140 may include an outlet. The outlet may be disposed directly below the battery pack 110 when the battery pack 110 is connected to the battery charger 105. The outlet allows cooling air to pass through the fan 140 disposed on the second surface 130 and provide the cooling air to the battery pack 110. In other embodiments, the fan 140 may be an inlet. In such an embodiments, the fan 140 may draw cooling air to provide the cooling air to the battery pack 110. In such an embodiment, air inlets 145, 150, and/or 155 may be air outlets.

Figure 4:
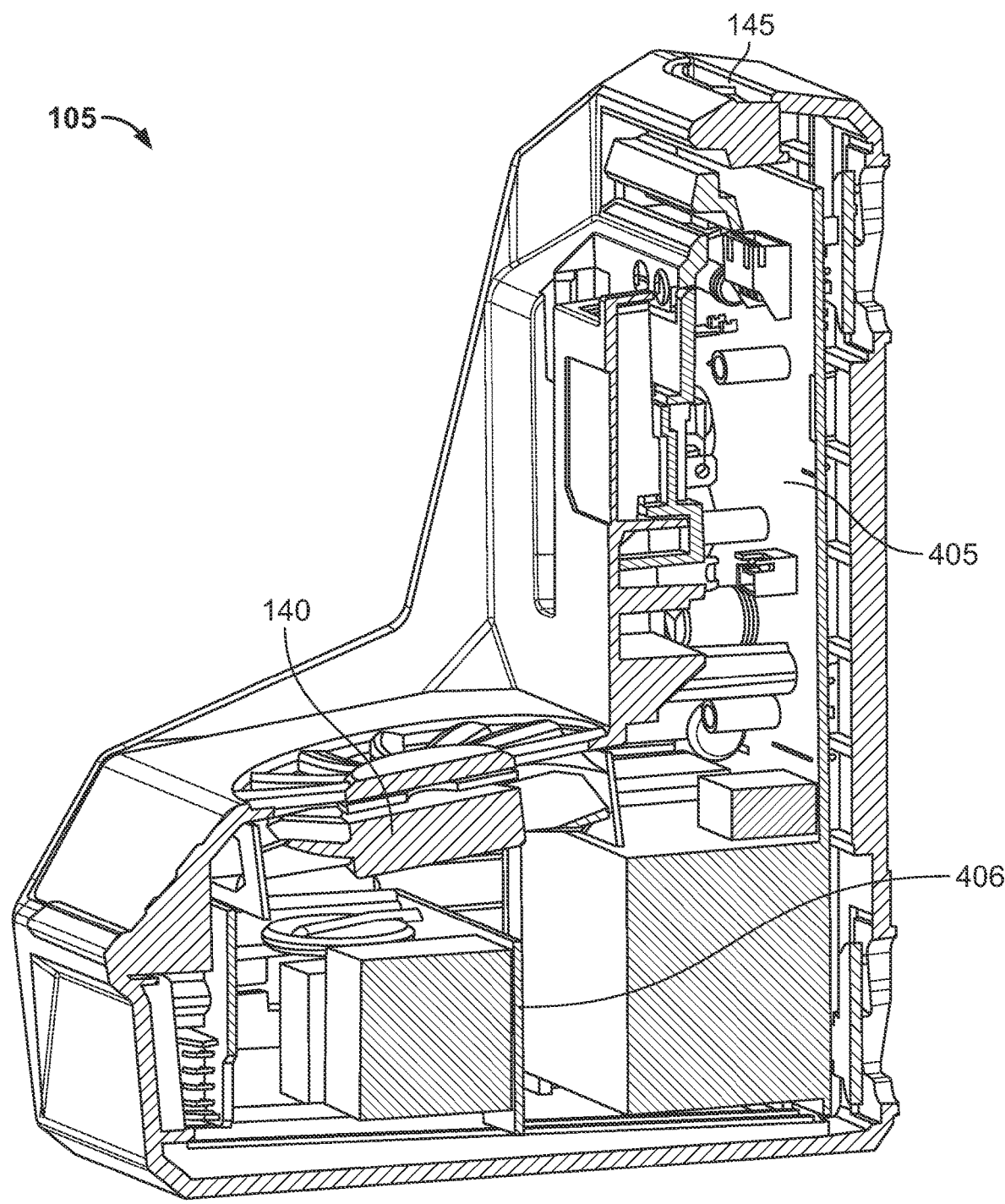
FIG. 4 is a cross-sectional view of the battery charger along the 5-5 line of the system of FIG. 1 in accordance with an embodiment of the disclosure.

FIG. 4 illustrates a cross-sectional perspective view of the battery charger 105 along the 5-5 line (of FIG. 2) according to some embodiments. The battery charger 105 may include the fan 140 and the first air inlets 145. The battery charger 105 may further include a circuit board 405. In some examples, the circuit board 405 may be a printed circuit board ("PCB"). In some examples, the circuit board 405 may be disposed within the vertical section 115 and positioned perpendicular to the first direction D1. In some examples, the circuit board 405 may control an operation of the fan 140. For example, the circuit board 405 may turn the fan 140 on or off, control a speed of the fan 140, a rotational direction of the fan 140, a volume of air exhausted (or taken in) by the fan 140, and/or any other operation of the fan 140. For example, the circuit board 405 may control a volume of air received through the first air inlet(s) 145, the second air inlet(s) 150, and/or the third air inlet(s) 155 to supply the fan 140 to cool the battery pack 110.

In some examples, the circuit board 405 may turn the fan 140 on or off based on a charging mode or a temperature of the circuit board 405. The charging mode may be a first charging mode (e.g., a turbocharging mode) or a second charging mode (e.g., a normal charging mode). The charging mode may be selected based on a determined status of the battery pack 110 via the circuit board 405, a user input via the battery charger 105, and/or a sensed battery voltage of the battery pack 110 via the circuit board 405. When the battery charger 105 is in the first charging mode, the circuit board 405 may control the fan 140 to be on and the battery charger 105 supplies a first charging current (e.g., a 12 Ampere charging current) to the battery pack 110. When the battery charger 105 is in the second charging mode, the fan 140 is off and the battery charger 105 may supply a second charging current. In some examples, the second charging current may be less than the first charging current. In some examples, the battery charger 105 may further include a temperature sensor. The temperature sensor may sense the temperature of the circuit board 405 and transmit a signal indicative of the temperature of the circuit board 405 to the circuit board 405. In some embodiments, the temperature sensor may be located proximate the circuit board 405. In other embodiments, the temperature sensor may be located proximate the attachment portion 135 and sense a proximate temperature of the battery pack 110 received by the attachment portion 135. In the second charging mode, the circuit board 405 may control the fan 140 to be on when the signal indicative of the temperature of the circuit board 405 exceeds a first temperature threshold. In the second charging mode, the circuit board 405 may control the fan 140 to be off when the signal indicative of the temperature of the circuit board 405 decreases below a second temperature threshold. In some examples, the first temperature threshold may be greater than the second temperature threshold. In other examples, the first temperature threshold may be the same as the second temperature threshold.

Additionally, the battery charger 105 may further include a second circuit board 406 disposed below the fan 140. According to one or more embodiments, the second circuit board 406 has a height less than the first circuit board 405. According to one or more embodiments, the second circuit board 406 may control operation of the fan 140. While the drawings show the battery charger 105 having the second circuit board 406, one or more embodiments may omit the second circuit board 406 such that the fan 140 is controlled by the first circuit board 405. According to one or more embodiments, the first circuit board 405 is the only circuit board in the battery charger 105.

Figure 5:
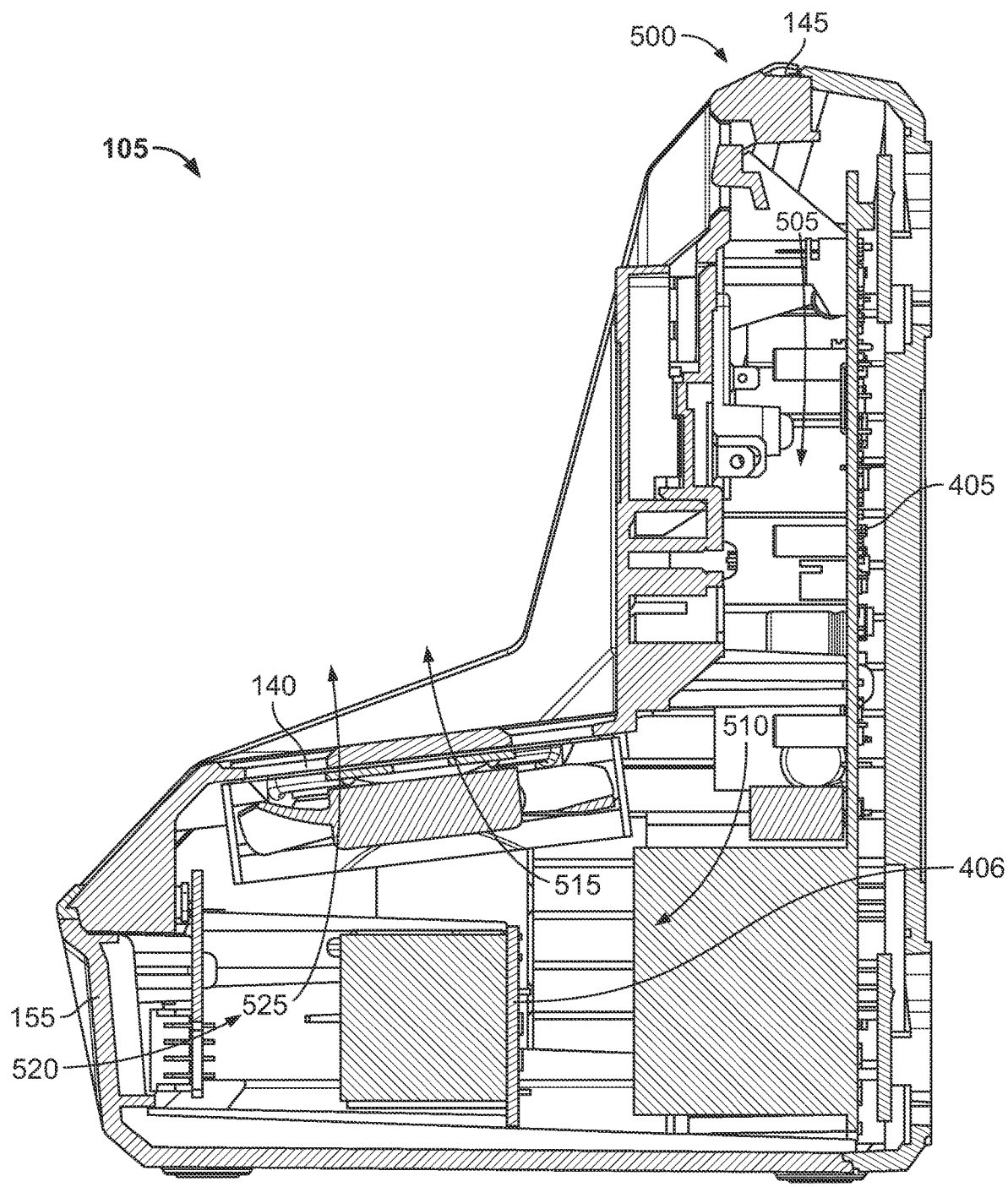
FIG. 5 is a cross-sectional view of a battery charger along the 5-5 line of the system of FIG. 1 in accordance with an embodiment of the disclosure.

FIG. 5 illustrates a side cross-sectional view of a battery charger 105 along the 5-5 line (FIG. 2) according to some embodiments. As stated above, the circuit board 405 may control operation of the fan 140 to induce air flow through the battery charger 105. For example, the circuit board 405 may control operation of the fan 140 to pull air from the surrounding environment of the battery charger 105 through the first air inlet 145 along a first airflow path 500. The fan 140 may pull air from the first airflow path 500 through the vertical section 115 along a second airflow path 505. The fan 140 may pull air from the second airflow path 505 to cool the circuit board 405 along a third airflow path 510 as the air is pulled into the horizontal section 125. The fan 140 may pull air from the third airflow path 510 and exhaust the air through the outlet of the fan 140 along a fourth airflow path 515. In some examples, when the battery pack 110 is connected to the battery charger 105 and the fan 140 pulls air along the fourth airflow path 515, the fan 140 may exhaust the air along the fourth airflow path 515 to provide cooling air to the battery pack 110 via the outlet. In some examples, the fan 140 may also pull air from the second air inlet 150 and/or the third air inlet 155 in addition to the first air inlet 145 to provide cooling air to the battery pack 110 along the fourth airflow path 515. For example, the circuit board 405 may control operation of the fan 140 to pull air from the surrounding environment of the battery charger 105 through the third air inlet 155 along a fifth airflow path 520 into the horizontal section 125. The fan 140 may pull air from the fifth airflow path 520 and exhaust the air through the outlet of the fan 140 along a sixth airflow path 525. In some examples, when the battery pack 110 is connected to the battery charger 105 and the fan 140 pulls air along the sixth airflow path 525, the fan 140 may exhaust the air along the sixth airflow path 525 to provide cooling air to the battery pack 110 via the outlet.

Figure 6:
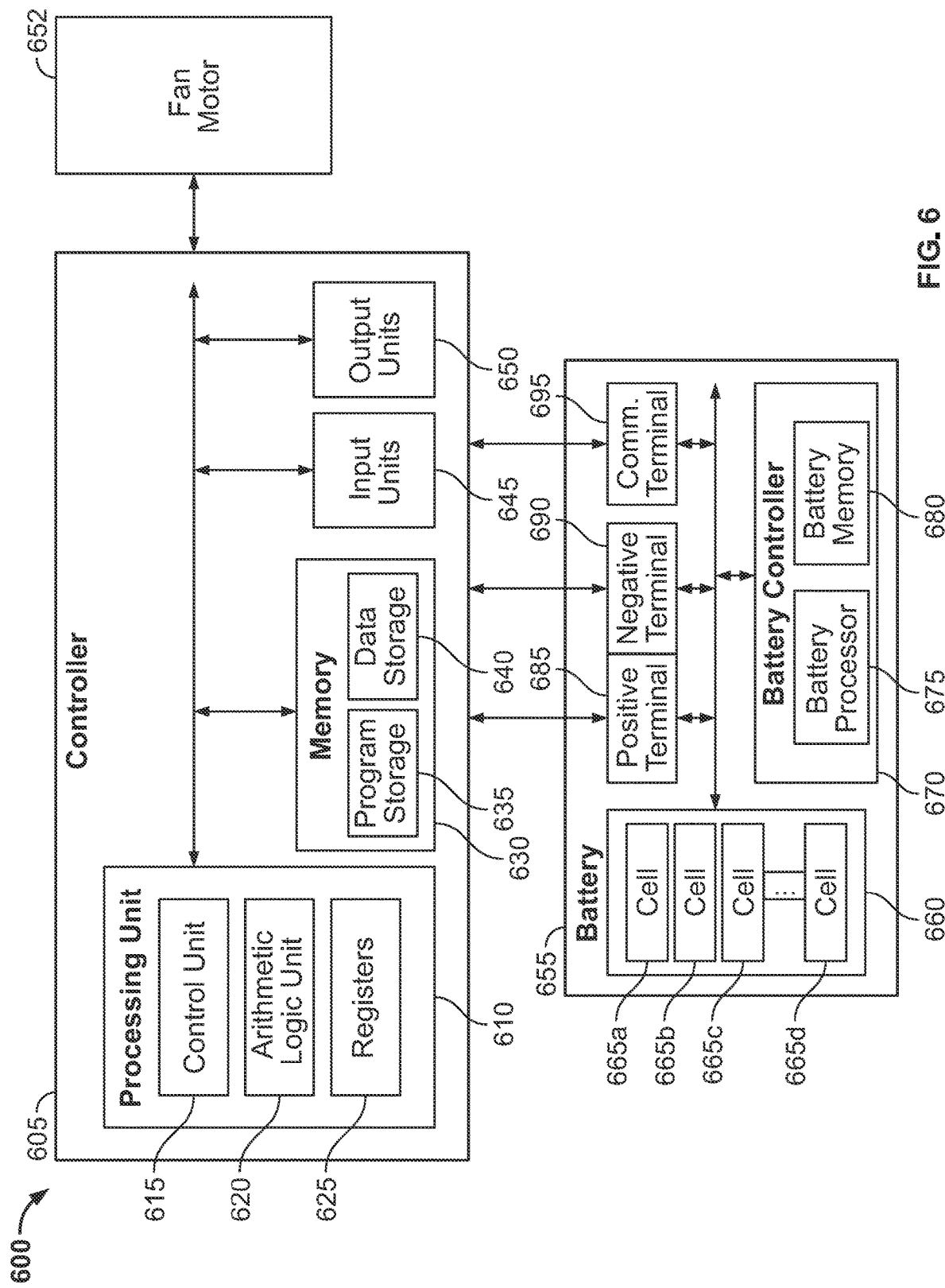
FIG. 6 is a block diagram of a system including a battery charger and a battery pack, in accordance with an embodiment of the disclosure.

FIG. 6 is a block diagram of a control system 600 of the battery charger 105, according to some examples. The control system 600 may include a controller 605, as well as other components not pictured in FIG. 6, for example a motor, a solenoid, and/or other mechanical and/or electrical components described above. In some examples, the controller 605 may be included as a part of the circuit board 405. The controller 605 may include a processing unit 610 comprising a control unit 615, an arithmetic logic unit 620, and one or more registers 625. The controller 605 may further include a memory 630 consisting of program storage 635 and/or data storage 640. The memory 630 may be flash memory, random access memory, solid state memory, another type of memory, or a combination of these types. The controller 605 may further include one or more input units 645 and/or output units 650. In some embodiments, the one or more input units 645 may be configured to receive a plurality of inputs such as a mode switch signal, signals from one or more sensors (e.g., the temperature signal), a battery current signal, a battery temperature signal, or a battery voltage signal. In some embodiments, the one or more output units 650 may be configured to transmit a plurality of outputs such as a signal to control an operation of the fan 140, a signal to control a plurality of light-emitting diodes (LEDs), or a signal to control a plurality of FETs connected to the motor. For example, the controller 605 may include an IC chip, PID controller, programmable logic controllers, and/or the like. The processing unit 610 may include a microprocessor, a microcontroller, or another suitable programmable device.

The memory 630 is a non-transitory computer readable medium that includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 610 is connected to the memory 630 and executes software instructions that are capable of being stored in a RAM of the memory 630 (e.g., during execution), a ROM of the memory 630 (e.g., on a generally permanent basis), or another non-transitory computer readable medium such as another memory or a disc. Software included in the implementation of the battery pack 110 or the fan 140 can be stored in the memory 630 of the controller 605. The software includes, for example, firmware, one or more applications, program data, filters, rules, one or more program modules, and other executable instructions. The controller 605 may retrieve from memory and execute, among other things, instructions related to the control of the charging of the battery pack 110 described herein. In other examples, the controller 605 may retrieve from memory and execute, among other things, instructions related to the control of the fan 140 described herein. In other constructions, the controller 605 includes additional, fewer, or different components. As illustrated, the controller 605 may be electronically and/or communicatively coupled to a fan motor 652. The fan motor 652 may receive control signals from the controller 605 and operate the fan 140 based on the control signals.

The battery pack 655 may include a stack 660 consisting of one or more battery cells 665. In some embodiments, the one or more battery cells 665 (e.g., lithium ion cells or cells having similar chemistry) are electrically connected to each other in a series-type manner. In other embodiments, the one or more battery cells 665 are electrically connected to each other in a parallel-type manner. In still other embodiments, the one or more battery cells 665 are electrically connected to each other in a combination of a series-type and a parallel-type manner. In some examples, the battery pack 655 may be the same as the battery pack 110. The battery pack 655 may further include a battery pack controller 670 consisting of a battery processor 675 and a battery memory 680. The battery pack 655 may further include a positive battery terminal 685 and a negative battery terminal 690. The positive battery terminal 685 and the negative battery terminal 690 may be configured to electrically and/or mechanically couple to corresponding terminals of the battery charger 105. In some embodiments, the battery pack 655 includes a communication terminal 695, which may be configured to electrically, mechanically, and/or communicatively couple to one or more communication terminals of the battery charger 105.

In some embodiments, such as the block diagram of FIG. 6, the one or more battery cells 665 are connected to the battery pack controller 670. The battery pack controller 670 controls the power delivered to the positive battery terminal 685 and the negative battery terminal 690 (for example, via control of a discharge field-effect transistor (FET), a charge FET, and/or other FETs located within the battery pack). In some embodiments, the battery pack controller 670 controls the power by allowing or prohibiting power. Additionally, in some embodiments, the battery pack controller 670 controls the power by allowing a percentage of power generated by the one or more battery cells 665 to be output. In some embodiments, the amount of power delivered between the battery terminals 685, 690 is approximately 100% of power possibly generated by the one or more battery cells 665.

Although the present subject matter has been described in detail with reference to certain preferred embodiments, variations and modifications exist within the scope of one or more independent aspects of the present subject matter as described.

What is claimed is:

1. A charger comprising:
a vertical section including a first surface, the first surface facing a front direction and including an attachment portion configured to a receive a battery pack, the battery pack including a first side configured to be received by the attachment portion and a second side opposite the first side;
a horizontal section configured to protrude, in the front direction, from a bottom portion of the vertical section;
a second surface disposed on the horizontal section, the second surface facing an upward direction; and
a fan disposed proximate the second surface, the fan configured to cool the battery pack, wherein an entirety of the fan is configured to overlap the first side of the battery pack in the upward direction such that the fan exhausts air on and around the first side to the second side.

2. The charger of claim 1, wherein the fan includes an outlet, the outlet disposed directly below the battery pack.

3. The charger of claim 2, further comprising:
a first air inlet disposed on the first surface, the first air inlet positioned above the attachment portion;
a second air inlet disposed on a first side of the vertical section, the second air inlet including a patterned surface; and
a third air inlet disposed on a first intermediate side of the horizontal section, the intermediate side located between the first side of the vertical section and a front side of the horizontal section.

4. The charger of claim 3, further comprising:
a fourth air inlet disposed on a second side of the vertical section, the fourth air inlet positioned to correspond to the second air inlet across a median plane of the charger; and
a fifth air inlet disposed on a second intermediate side of the horizontal section, the fifth air inlet positioned to correspond to the third air inlet across the median plane of the charger.

5. The charger of claim 4, further comprising:
a circuit board disposed in the vertical section, the circuit board positioned perpendicular to the front direction.

6. The charger of claim 5, wherein the circuit board is configured to control an operation of the fan.

7. The charger of claim 6, wherein the fan is further configured to:
pull air through the vertical section;
cool the circuit board using the air pulled from the vertical section; and
exhaust the air from the outlet.

8. The charger of claim 1, wherein the vertical section is oriented at a first angle between 75 degrees and 105 degrees relative to the horizontal section.

9. The charger of claim 1, wherein the horizontal section is oriented at a second angle between -15 degrees and 15 degrees relative to the vertical section.

10. A charger comprising:
an attachment portion configured to receive a battery pack;
a vertical section including a first surface, the first surface facing a front direction and including the attachment portion;
a horizontal section configured to extend, in the front direction, from a bottom portion of the vertical section;
a second surface disposed on the horizontal section, the second surface facing an upward direction;
a fan disposed proximate the second surface, the fan configured to cool the battery pack;
a first air inlet disposed on a first side of the vertical section; and
a second air inlet disposed on the first surface, the second air inlet positioned above the attachment portion.

11. The charger of claim 10, wherein an entirety of the fan is configured to overlap the battery pack in the upward direction.

12. The charger of claim 10, further comprising an outlet disposed directly below the battery pack.

13. The charger of claim 10, further comprising:
the first air inlet including a patterned surface; and
a third air inlet disposed on a first intermediate side of the horizontal section, the intermediate side located between the first side of the vertical section and a front side of the horizontal section.

14. The charger of claim 13, further comprising:
a fourth air inlet disposed on a second side of the vertical section, the fourth air inlet positioned to correspond to the second air inlet across a median plane of the charger; and
a fifth air inlet disposed on a second intermediate side of the horizontal section, the fifth air inlet positioned to correspond to the third air inlet across the median plane of the charger.

15. The charger of claim 14, further comprising:
a circuit board disposed in the vertical section, the circuit board positioned perpendicular to the front direction.

16. The charger of claim 15, wherein the circuit board is configured to control an operation of the fan.

17. The charger of claim 16, wherein the fan is further configured to:
pull air through the vertical section;
cool the circuit board using the air pulled from the vertical section; and
exhaust the air from an outlet.

18. The charger of claim 10, wherein the vertical section is oriented at a first angle between 75 degrees and 105 degrees relative to the horizontal section.

19. The charger of claim 10, wherein the horizontal section is oriented at a second angle between −15 degrees and 15 degrees relative to the vertical section.

\* \* \* \* \*